United States Patent
Ila

(10) Patent No.: US 7,687,705 B2
(45) Date of Patent: Mar. 30, 2010

(54) EFFICIENT THERMOELECTRIC DEVICE

(75) Inventor: Daryush Ila, Normal, AL (US)

(73) Assignee: Alabama A&M University Institute, Normal, AL (US)

( * ) Notice: Subject to any disclaimer, the term of this patent is extended or adjusted under 35 U.S.C. 154(b) by 497 days.

(21) Appl. No.: 11/784,729

(22) Filed: Apr. 9, 2007

(65) Prior Publication Data

US 2007/0235070 A1 Oct. 11, 2007

Related U.S. Application Data

(60) Provisional application No. 60/790,612, filed on Apr. 10, 2006.

(51) Int. Cl.
*H01L 35/28* (2006.01)
*H01L 35/22* (2006.01)

(52) U.S. Cl. ............... 136/224; 136/225; 136/203; 136/205

(58) Field of Classification Search .......... 136/200–242
See application file for complete search history.

(56) References Cited

U.S. PATENT DOCUMENTS

| | | | | |
|---|---|---|---|---|
| 5,288,336 | A | * | 2/1994 | Strachan et al. ............. 136/200 |
| 6,534,784 | B2 | * | 3/2003 | Eliasson et al. ............... 257/25 |
| 6,605,722 | B2 | | 8/2003 | Makovec et al. |
| 7,179,986 | B2 | | 2/2007 | Harman et al. |

OTHER PUBLICATIONS

Ila et al., Nano-cluster engineer: A combined ion implantation/co-deposition and ionizing radiation, Nuclear Instruments and Methods in Physics Research B, 191, pp. 416-421, Feb. 8, 2002.*

Xiao et al., MeV Si ion bombardments of thermoelectric BixTe3/Sb2Te3 multilayer thin films for reducing thermal conductivity, Nuclear Instruments and Methods in Physics Research B, 241, pp. 568-572, Aug. 15, 2005.*

Zimmerman et al., Ion beam assisted formation of nanolayers, Nuclear Instruments and Methods in Physics Research B, 241, pp. 506-510, Nov. 4, 2005.*

Budak et al., Effect of MeV Si Ion Bombardment on Thermoelectric Characteristics of Sequentially Deposited SiO2/AuxSiO2(1-x) Nanolayers, Materials Research Society Symposium Proceedings, 929, 0929-II04-10, Apr. 2006.*

Cahill, David G., "Thermal conductivity measurements from 30 to 750K: the 3ω method," Review of Scientific Instrumentation, 61(2), Feb. 1990 pp. 802-808.

(Continued)

*Primary Examiner*—Jessica L. Ward
*Assistant Examiner*—Kevin E Yoon
(74) *Attorney, Agent, or Firm*—James Richards

(57) ABSTRACT

A high efficiency thermo electric device comprising a multi nanolayer structure of alternating insulator and insulator/metal material that is irradiated across the plane of the layer structure with ionizing radiation. The ionizing radiation produces nanocrystals in the layered structure that increase the electrical conductivity and decrease the thermal conductivity thereby increasing the thermoelectric figure of merit. Figures of merit as high as 2.5 have been achieved using layers of co-deposited gold and silicon dioxide interspersed with layers of silicon dioxide. The gold to silicon dioxide ratio was 0.04. 5 MeV silicon ions were used to irradiate the structure. Other metals and insulators may be substituted. Other ionizing radiation sources may be used. The structure tolerates a wide range of metal to insulator ratio.

16 Claims, 13 Drawing Sheets

OTHER PUBLICATIONS

Nakamoto, Go et al. "Thermoelectric properties of $Zn_{13-x}Sb_{10}$ compounds at low temperatures" Journal of Alloys and Compounds, vol. 437, Issues 1-2, Sep. 25, 2006, pp. 151-156.

Ramesh Chandra Mallik, Jae-Yong Jung, V. Damodara Das, Soon-Chul Ur and Il-Ho Kim "Thermoelectric properties of $Sn_zCo_8Sb_{24}$ skutterudites" Solid State Communications, vol. 141, Issue 4, Nov. 7, 2006, pp. 233-237.

J.L. Mi, X.B. Zhao, T.J. Zhu and J. Ma "Thermoelectric properties of skutterudites $Fe_xNi_yCo_{1-x-y}Sb_3$ (x = y)" Journal of Alloys and Compounds, Dec. 4, 2006, 5 pages.

Shigeru Katsuyama, Ryosuke Matsuo and Mikio Ito "Thermoelectric properties of half-Heusler alloys $Zr_{1-x}Y_xNiSn_{1-y}Sb_y$," Journal of Alloys and Compounds, vol. 428, Issues 1-2, May 15, 2006, pp. 262-267.

H.J. Liu, Ch.M. Song, S.T. Wu and L.F. Li "Processing method dependency of thermoelectric properties of $Bi_{85}Sb_{15}$ alloys in low temperature", Cryogenics, vol. 47, Issue 1, Jan. 2007, pp. 56-60.

Taek-Soo Kim and Byong-Sun Chun "Microstructure and thermoelectric properties of n- and p-type $Bi_2Te_3$ alloys by rapid solidification processes" Journal of Alloys and Compounds, vol. 437, Issues 1-2, 28 Nov. 9, 2006, pp. 225-230.

M. Takashiri, T. Shirakawa, K. Miyazaki and H. Tsukamoto, "Fabrication and characterization of $Bi_{0.4}Te_{3.0}Sb_{1.6}$ thin films by flash evaporation method," Journal of Alloys and Compounds, vol. 441, Issues 1-2, Nov. 13, 2006, pp. 246-250.

Jiangying Peng, et al. "Effect of Fe substitution on the thermoelectric transport properties of $CoSb_3$-based Skutterudite compound," Journal of Alloys and Compounds, vol. 426, Issues 1-2, Mar. 10, 2006, pp. 7-11.

E. Alleno, D. Bérardan, C. Godart, M. Puyet, B. Lenoir, R. Lackner, E. Bauer, L. Girard and D. Ravot Double filling in skutterudites: A promising path to improved thermoelectric properties, Physica B: Condensed Matter, vol. 383, Issue 1, Aug. 15, 2006, pp. 103-106.

* cited by examiner

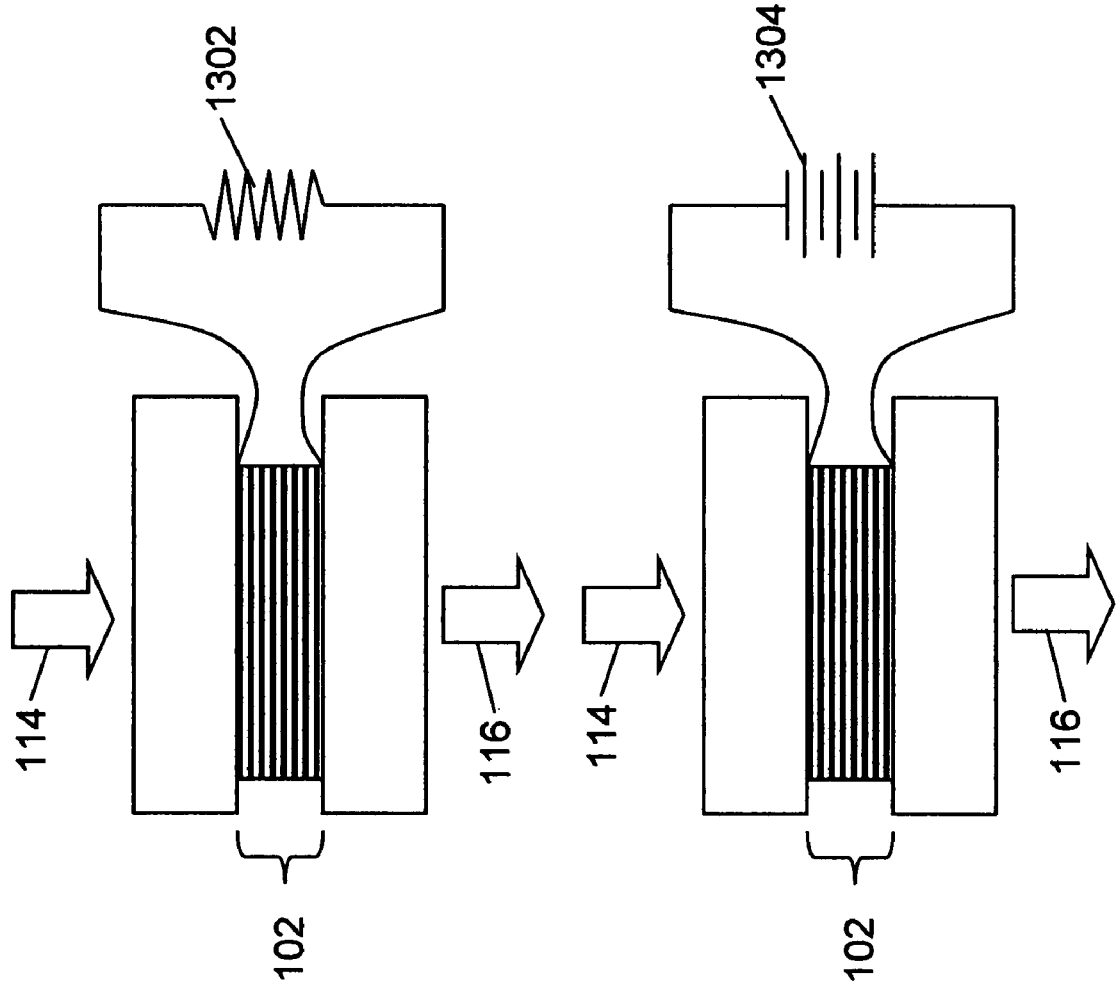

EFFICIENT THERMOELECTRIC DEVICE

RELATED APPLICATIONS

This application claims the benefit under 35 USC 119(e) of prior provisional application 60/790,612 titled "Efficient Thermoelectric Device," filed Apr. 10, 2006 by ILA, which is incorporated herein by reference in its entirety.

GOVERNMENT RIGHTS

The U.S. Government has a paid-up license in this invention and the right in limited circumstances to require the patent owner to license others on reasonable terms as provided for by the terms of contract number NAG8-1933 from NASA, Huntsville, Ala.

BACKGROUND

1. Field of the Invention

The present invention pertains generally to the field of Thermoelectric Devices, more particularly to the field of materials and treatments yielding improved efficiency in thermoelectric devices.

2. Background of the Invention

Thermoelectric (TE) devices convert heat directly to electrical power, or conversely, create heating or cooling directly from electrical power. The devices are entirely solid state, with no moving parts to wear out. They are very rugged and can last indefinitely. Their main shortcoming has been their low efficiency. The low efficiency relegates TE devices to a few applications where their simplicity and ruggedness outweighs the inefficiency, such as sensors and waste heat energy converters. More recently, advances in semiconductor TE devices have made practical small coolers and temperature controllers that can both heat or cool as needed to control a temperature. Applications range from cooling computer chips to appliances for the home.

The potential for TE devices, however, is much greater. If the efficiency can be increased, TE devices can begin to supplant mechanical compressor refrigeration systems, gasoline generators, geothermal power production and more. TE devices could play a significant role in the energy production, home heating/cooling and general energy management of the future.

More recent advances in TE devices have shown that quantum dot and superlattice structures combined with semiconductor technology can produce even higher efficiency factors. One such example is disclosed in U.S. Pat. No. 6,605,772, wherein Pb Se Te/Pb Te quantum dot superlattice structure was found capable of a figure of merit (ZT) of 0.9 near room temperature (300K).

Although improvements have been made, further improvement in efficiency is needed before TE devices can compete with the energy conversion machines that presently dominate industry. To reach their full potential, these improvements will need to use techniques that can be manufactured economically and result in rugged and reliable devices.

Therefore there is a clear need for thermoelectric devices that have improved efficiency, are easy to manufacture, and are rugged and reliable devices in the field.

BRIEF DESCRIPTION OF THE INVENTION

Briefly, the present invention relates to a high efficiency thermo electric device comprising a multi nanolayer structure of alternating insulator and insulator/metal material that is irradiated across the plane of the layer structure with ionizing radiation. The ionizing radiation produces nanocrystals in the layered structure that increase the electrical conductivity and decrease the thermal conductivity thereby increasing the thermoelectric figure of merit. Figures of merit as high as 2.5 have been achieved using layers of co-deposited gold and silicon dioxide interspersed with layers of silicon dioxide. The gold to silicon dioxide ratio was 0.04. 5 MeV silicon ions were used to irradiate the structure. Other metals and insulators may be substituted. Other ionizing radiation sources may be used. The structure tolerates a wide range of metal to insulator ratio.

These and further benefits and features of the present invention are herein described in detail with reference to exemplary embodiments in accordance with the invention.

BRIEF DESCRIPTION OF THE FIGURES

The present invention is described with reference to the accompanying drawings. In the drawings, like reference numbers indicate identical or functionally similar elements. Additionally, the left-most digit(s) of a reference number identifies the drawing in which the reference number first appears.

FIG. 13A and FIG. 13B illustrate the use of the multilayer stack as a thermoelectric generator and as a thermoelectric cooler or heater.

DETAILED DESCRIPTION OF THE INVENTION

The present invention achieves high efficiency by building a multilayer structure using alternate layers of insulator and co-deposited metal with insulator, i.e. one layer of insulator followed by a second layer of co-deposited metal with insulator, and then repeat the dual layers 100 to 1000 times or more, as desired. The structure is then irradiated with ionizing radiation to produce nanocrystals of the metal in the co-deposited layers. The irradiation serves to increase the electrical conductivity of the structure, which increases the figure of merit (ZT) and to decrease the thermal conductivity of the structure, further increasing the figure of merit. One exemplary device tested used gold in combination with silicon dioxide.

Some of the more recent TEG and Peltier prior art devices have been reported to have a figure of merit from below 1 to as high as 2 near room temperature (300° K). However, test devices constructed in accordance with the present invention have demonstrated figures of merit greater than 2.5 at room temperature. Moreover, based on the melting points of the components, the devices are expected to be capable of operation at temperatures on the order of 1000° K where the figure of merit could be three times the value at 300K. Such operation suggests potential for efficiency greater than 20%—comparable to that of an automobile engine.

Technology Background

The figure of merit, ZT, relates the critical properties of the device that determine the efficiency potential of the device.

$$ZT = S^2 \sigma T/k \qquad \text{Equation 1.}$$

where,

S is the Seebeck coefficient,

σ is the electrical conductivity,

T is the absolute temperature, Kelvin k is the thermal conductivity.

Thus, it can be seen that the figure of merit is increased by increasing the Seebeck coefficient, and/or electrical conductivity and by decreasing the thermal conductivity. Increasing the temperature of operation also increases the figure of merit.

The Seebeck coefficient relates the voltage achieved by a temperature difference across the TE device and is typically expressed in microvolts per degree Kelvin.

The electrical conductivity refers to the conductivity parallel to the direction of heat transfer. The units are (ohm-cm)$^{-1}$.

The thermal conductivity through the layers is desired. Thin films present challenges to the measurement of thermal conductivity. A third harmonic technique (also referred to as a three omega, 3 ω technique) may be used to determine thin film thermal conductivity.

DETAILED DESCRIPTION OF THE PREFERRED EMBODIMENTS

Figure 1:
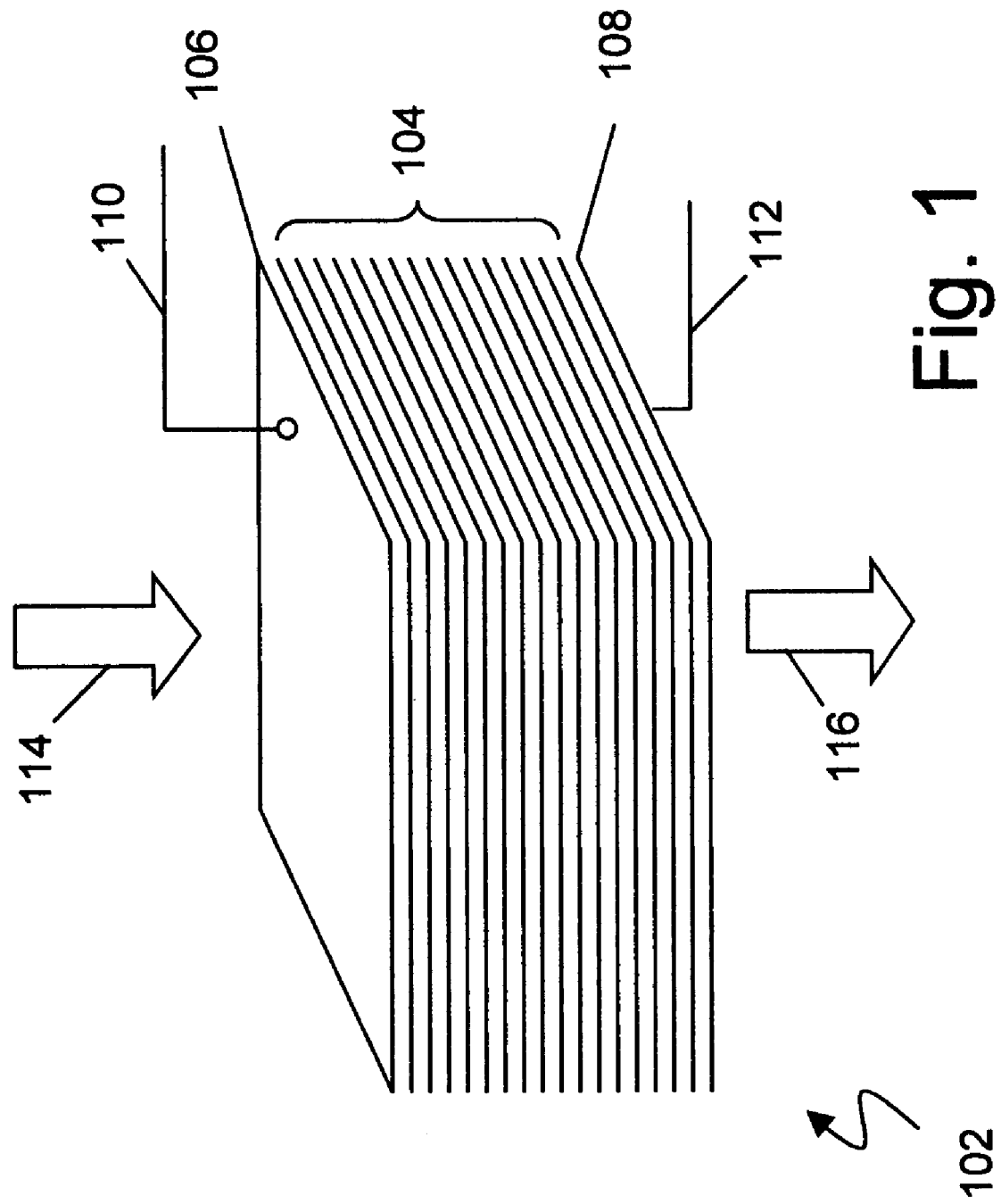
FIG. 1 depicts an exemplary thermoelectric layer structure in accordance with the present invention.

FIG. 1 depicts an exemplary thermoelectric layer structure in accordance with the present invention. FIG. 1 and other drawings in this disclosure may be exaggerated in scale to show more clearly the nano layers of the multilayer structure. Referring to FIG. 1, the layer structure 102 comprises a sequence of alternating layers 104 of insulator and co-deposited metal/insulator. Each layer is typically on the order of several nanometers thick. A stack of layers may be fabricated by a deposition process, such as MBE or IBAD. Once a stack is fabricated, the stack is irradiated with ionizing radiation to generate nanocrystals in the metal/insulator layers. The sequence of alternating layers 104 is sandwiched between two electrical/heat contact layers 106 and 108. The electrical and heat contact layers 106 108 provide efficient electrical current distribution from contact wires 110, 112 to the full area of the stack of alternating layers 104 and provide efficient thermal contact between the stack 104 and heat source and sink structures (not shown) that may be in contact with the layer structure 102. The direction of heat transfer is shown by the arrows to be perpendicular to the plane of the layers comprising the stack 104. Equivalently, the direction of heat transfer may be characterized as from layer to layer rather than laterally within a layer, or cross plane rather than in plane.

The device 102 may be used in either thermoelectric generator mode, i.e., for generation of electrical energy, or in thermoelectric cooling or heating mode, also referred to as Peltier mode, i.e., for heating or cooling.

Figure 2:
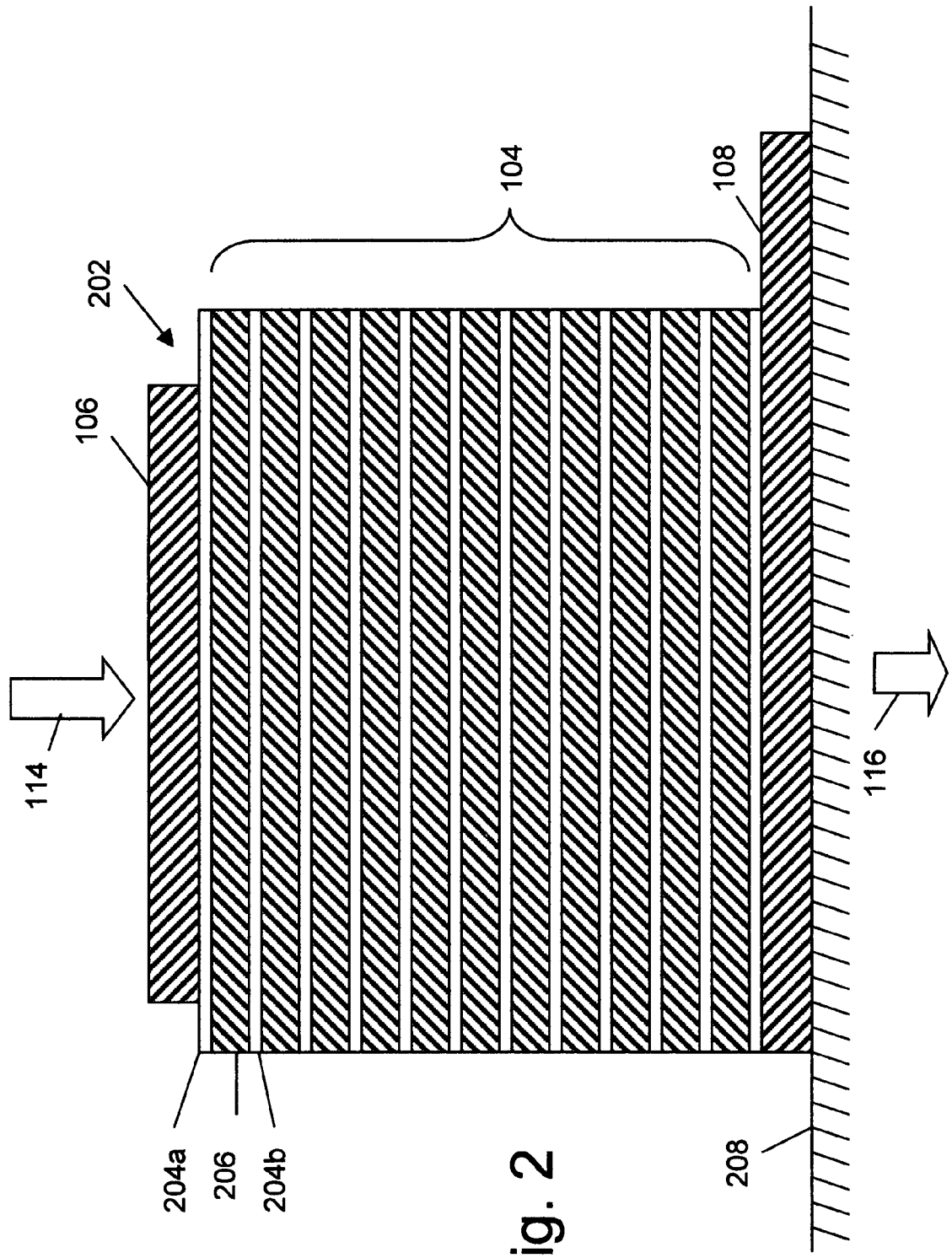
FIG. 2 depicts a cross section of the stack of FIG. 1.

FIG. 2 depicts a cross section of the stack of FIG. 1. FIG. 2 shows the sequence of alternating layers 104 and the two electrical/thermal contact layers 106 108 on opposite sides of the stack of alternating layers 104. The alternating layers comprise insulating layers 204a, 204b and co-deposited metal/insulator layers 206. Test samples used SiO$_2$ for the insulating layers 204a 204b and SiO$_2$ with gold for the composite layers 206. The composition of the composite layers is referred to as Au$_x$/SiO$_{2(1-x)}$, where x is the percentage of gold, and 1-x is the percentage of SiO$_2$. The contact layers 106 108 may be any suitable conductor, typically gold, copper, silver, or aluminum. The test samples used gold.

Layer forming methods include Molecular Beam Epitaxy (MBE), ion beam assisted deposition (IBAD)(also referred to as e-beam evaporation), vacuum evaporation, sputtering and other methods that yield a uniform mixture and yield a controlled layer thickness. An exemplary insulating layer 204a 204b thickness is 1 to 2 nanometers (nm) and exemplary composite layer 206 thickness is 10 nm. It is an advantage of the invention that all of the layers, including the contact layers, may be grown in the same chamber run sequence using one vacuum pump down cycle. The deposition of alternate layers may be achieved by turning on and off various sources associated with each layer. The capability to form a large number of layers in a single chamber vacuum cycle can lower production costs for a mass produced product.

Silicon dioxide was used for the insulating layers 204a, 204b and for the insulating component of the composite layer 206 in the tested samples. Other untested insulating materials that are expected to perform well include, but are not limited to: silicon monoxide, silicon nitride, aluminum oxides, vanadium oxides, magnesium fluoride, zinc sulphide, titanium dioxide, and calcium fluoride. The insulator should generally be capable of supporting the nanoclusters resulting from the irradiation and providing a small gap between nanoclusters along the ion track. A good insulator has electrical insulation properties, low thermal conductivity, and can allow tunneling of electrons from one nanocluster the next nanocluster. Although it may be preferred for convenience of the layer deposition process to use the same insulator material for the insulating layer and for the insulator material component of the composite layer, different materials may be used for the different layers.

For the metal component of the metal-insulator composite 206, any metal may be used, including alloys. As long as the metals are conducting and even if the alloy metals change phase at various temperatures. Exemplary metals that are expected to perform well, but have not been tested include, but are not limited to: silver, copper, platinum, and aluminum.

The metal layers 106 108 used for electrical and thermal contact may be any conducting metal or alloy or other conducting material. Gold and copper were used for the test samples, however other metals which are not tested but are expected to perform well include, but are not limited to: silver, aluminum, and platinum. The top metal layer 106 was etched back 202 to prevent short circuiting the stack 104.

Note also that the electrical contact layers and/or thermal contact layers may be conveniently applied during the deposition process, but may alternatively be applied by other methods, such as coating, painting, electroplating, or by contacting the layer structure.

The outer layers of the stack may be either type of layer, insulator 204a or composite layer 206.

The stack is typically deposited on a substrate 208. Fused silica and silicon have been used for test samples. In one embodiment, the substrate may be removed once the stack is formed.

Heat moves transverse (orthogonal) to the plane of the layers. In TE generator applications, heat is applied 114 to one side of the stack 104 and moves parallel to the ion tracks to the other side of the stack. In thermoelectric heating or cooling (Peltier) applications, heat is moved from one side along and parallel to the ion tracks to the other side.

Figure 3:
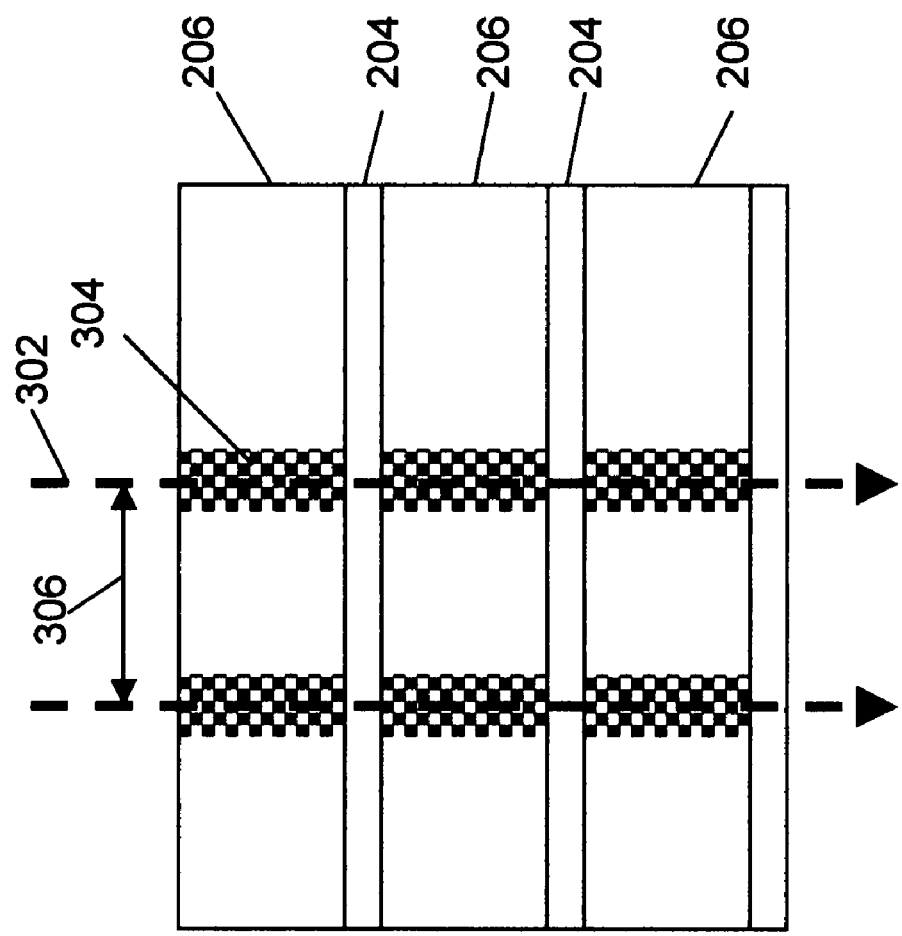
FIG. 3 illustrates the formation of nanoclusters by irradiation with ionizing radiation.

FIG. 3 illustrates the formation of nanoclusters by irradiation with ionizing radiation. FIG. 3 shows composite layers 206 of a stack separated by two insulating layers 204. Two ion tracks 302 are indicated. As the ion passes through the material, the atoms along the track 302 are heated to a very high temperature. As the material cools, the gold organizes into an associated crystal form that is conductive. The crystals 304, (also referred to as nanocrystals, nanoclusters, or quantum dots) are isolated from laterally neighboring crystals by relatively non-conducting gold/insulator. Regions where gold is drawn into the nanocrystal 304 leave a gold-depleated region, further isolating lateral nanocrystals 304. The distance 306 to adjacent ion tracks should be as close as possible without combining adjacent nanaocrystals 304. The nanocrystals are isolated from top and bottom crystals 304 by the insulating layers 204 that interrupt the crystal growth. The isolated crystals appear to behave as quantum dots as evidenced by optical measurements of similar structures that show the expected optical resonance from quantum dots of this size. Electrical conductivity of the stack is related to the electrical coupling from one crystal to the next along the ion track. The conduction may be due to the quantum nature of the nanocrystal and the close coupling across the insulator layer allowing conduction by tunneling or related mechanisms. Thus, one advantage of generating nanocyrstals by using ionizing radiation is that the nanocrystals are formed in linear alignment, i.e., end to end, along the path of the ion track.

Phonon propagation, however, is inhibited by the formation of these nanocrystals 304 that appear as obstacles that scatter the propagating phonons. The insulating layer and metal/insulator are originally poor conductors of heat and the irradiation process further reduces the thermal conductivity. Thus, the irradiation process serves to improve the thermoelectric figure of merit by increasing the electrical conductivity and decreasing the thermal conductivity.

The terms nanoclusters 304, nanocrystals 304, and quanatum dots 304 as used in this specification refer to the structures 304 produced in the nanolayers 104 by ionizing radiation, in particular ion bombardment. These ion track structures 304 appear to have properties described by these three terms. Nanoclusters are clusters of a small number of atoms, typically a few nanometers in dimension. Nanocrystals are nanoclusters having crystalline structure. Quantum dots are nanoclusters with electrical conductivity bands constrained in three dimensions. There is evidence that these ion track structures can exhibit quantum dot properties, but such properties may not be essential for good thermoelectric performance.

FIG. 3 illustrates the ion beam directed at a 90 degree angle to the plane of the layers; however, diagonal angles may be utilized as desired or as required by other constraints.

Figure 4:
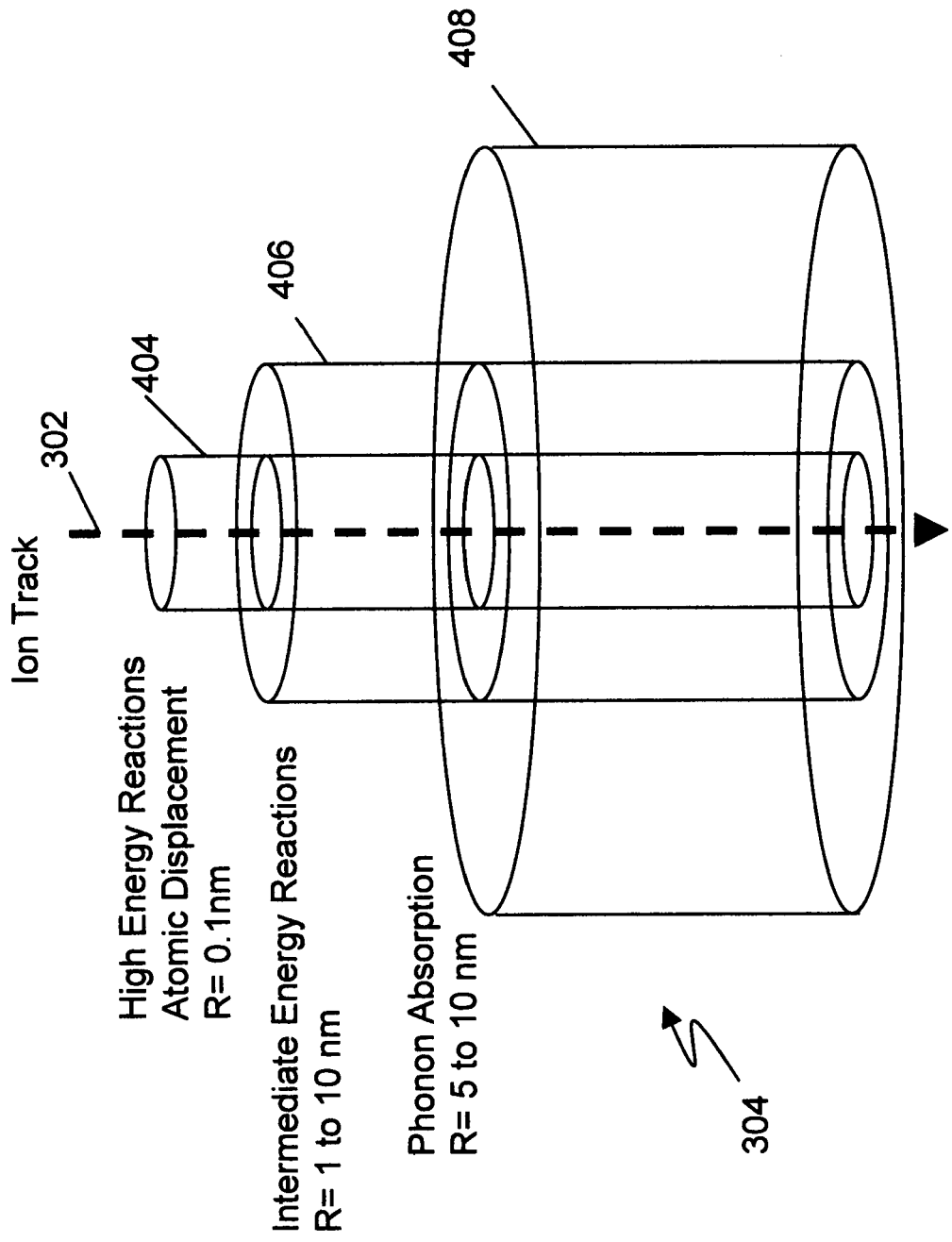
FIG. 4 illustrates several regions around a typical ion track.

FIG. 4 illustrates several regions around a typical ion track. FIG. 4 is suggestive of a 5 MeV silicon source in $Au_x/SiO_{2(1-x)}$. The regions are illustrative only and vary considerably depending on the ionizing radiation source and the composite target material used. The central core around the ion track may have a radius of 0.1 nm. This region receives high deposition energy density and may reach temperatures well above the melting point of the substrate. Atomic displacement reactions may occur. In the region from 1 nm to 10 nm, intermediate energy reactions may occur. From 5 to 10 nm phonon absorption occurs.

Ionizing radiation source may range from high z ions to x rays, including low z ions, electrons, gamma. The effectiveness of a particular source may depend on the metal and insulator used in the stack and the thickness of the stack. Electrons and gamma may penetrate a thicker stack, but will make much smaller quantum dots. 5 MeV silicon ions were used for test samples. 8 MeV gold and 5 MeV nitrogen are alternative exemplary ions that may be used.

Figure 5:
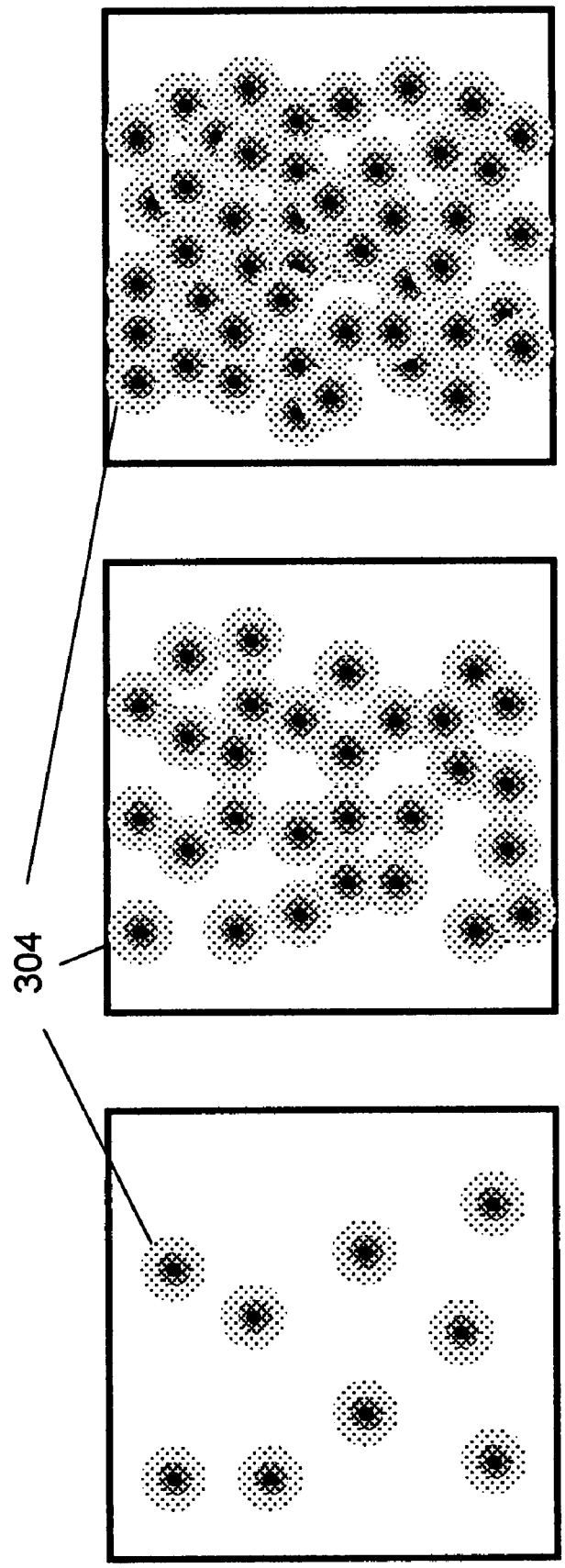
FIG. 5A-5C illustrate different radiation fluences from a random source.

FIG. 5A-5C illustrate different radiation fluences from a random source. Typical accelerators do not have precision control over the position of each ion, resulting in a random pattern of tracks. FIG. 5A shows a top view of a layer stack showing the positions of a sparse set of ion tracks for a low fluence. The regions of FIG. 4 are shown by shading. The tracks are essentially all isolated. FIG. 5B shows a higher fluence that is more optimum. The tracks are mostly isolated and most of the clear space is utilized. FIG. 5C shows a higher fluence where tracks are beginning to overlap causing shorts and disrupting operation.

Optimum quantum dot density, i.e., quantum dots per square centimeter, depends on the ionizing source used. One objective in determining optimum quantum dot density is to incorporate as much of the metal as possible into the quantum dots without overlapping quantum dots. As much as 90% of the metal may be associated with quantum dots, leaving 10% in the originally deposited state. To achieve this objective, the ionization fluence may be adjusted depending on the ionizing source. Heavy (high Z) ions, such as gold, will produce larger quantum dots because of the higher energy deposition per Å. Lighter ions, such as silicon, or sources such as electrons, gamma, or X rays will produce smaller quantum dots and will need higher fluence to achieve optimum quantum dot density.

A potential improvement anticipated by the inventor is to use a focused ion beam accelerator. Using a focused ion beam accelerator with the ability to focus the ion beam down to approximately a one nanometer spot and moving ion beam spot accurately on the surface, in two dimensions, X- and Y-forming the plane of the surface, would allow formation of a near perfect three dimensional pattern of quantum dots. The result is expected to lead to enhanced electrical conductivity related to reduced scattering points caused by lack of three dimensional periodicity, as well as better control in reducing the thermal conductivity. That is, absorbed phonons at high temperature layers will be propagated uniformly laterally. Improvement may also include increasing the absolute value of the Seebeck Coefficient and improved Peltier effect.

Figure 6:
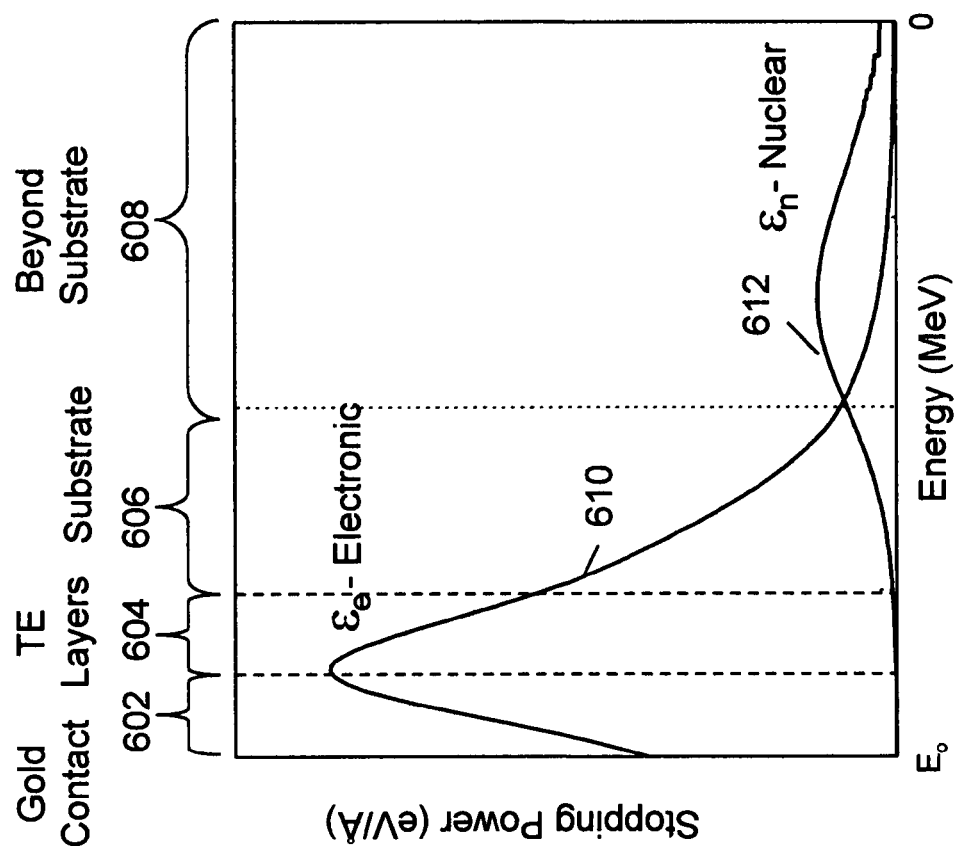
FIG. 6 illustrates a typical stopping power plot for an exemplary ion track through an exemplary stack.

FIG. 6 illustrates a typical stopping power plot 610 for an ion track through an exemplary stack. Stopping power is the energy loss of the ion per length of track. Referring to FIG. 6, the ion begins at 5 MeV, $E_0$ on the graph. Initially the ion impacts the gold contact layer 602 and loses energy through that layer. As the ion loses energy, the stopping power increases to a peak near the exiting of the gold layer. The ion then enters the TE layers 604 at maximum stopping power energy. As the ion loses further energy, the stopping power decreases, depositing less and less energy as the track progresses through the TE layers. This will generate a reduction in size of each nanocrystal 304 with each successive layer along the track. Upon exit from the stack 104, the ion continues to lose energy and stops somewhere beyond the layer stack. It is desired that the ion fully penetrate the stack 104 and not stop in the stack as this may cause disruption of the pattern and reduce performance.

In one embodiment, it is desired to produce the gradient in nanocrystal size as formed by the stopping power profile shown. The gradient in nanocrystal size may reduce thermal conductivity by deflecting phonons propagating in the direction toward the larger nanocrystals. Thus, the stack may be preferably operated with the side having large nanocrystals (toward the ion entry side) as the cold side and side having the smaller nanocrystals (toward the ion exit side) as the hot side.

The energy for a particular ion source may be selected by simulating the stopping power profile by using codes such as SRIM. In one embodiment, the energy may be selected for the gradient in deposition as shown in FIG. 6. Alternatively, the energy may be selected for the most uniform deposition, or for peak deposition within the TE layer region.

In an alternative embodiment, a gradient in nanocluster size may be generated by varying the metal fraction, x, as a function of layer number or by varying layer thickness with layer number, the layer number being a layer sequence number starting with the first layer deposited and incrementing for each subsequent layer.

TABLE 1

Samples of 50 period nanolayers of $SiO_2/Au_xSiO_{2(1-x)}$

| Fluence | Seebeck Coefficient | Electrical Conductivity | Thermal Conductivity | Figure of Merit |
|---|---|---|---|---|
| zero | −30.71 | 0.00495 | 0.0293 | $0.66 \times 10^{-4}$ |
| 1 e13/cm$^2$ | −30.86 | 0.00926 | 0.01725 | $1.53 \times 10^{-4}$ |
| 5 e13/cm$^2$ | −18.24 | 0.02272 | 0.01229 | $1.83 \times 10^{-4}$ |
| 1 e14/cm$^2$ | −60.00 | 1.66 | 0.000717 | 2.52 |

Table 1 shows the results of fabrication of an experimental sample of a 50 period stack comprising 50 SiO$_2$ layers and 50 co-deposited gold and SiO$_2$ layers. Several samples were grown on fused silica substrates and others grown on silicon substrates. The layers were deposited using an IBAD system. Two electron-gun evaporators were utilized, one configured with gold and the other with SiO$_2$. The gold contact layers, SiO$_2$ insulating layers and co-deposited gold and SiO$_2$ layers were formed by appropriately enabling and adjusting the two evaporators to produce each successive layer. The thickness of each layer was controlled and monitored by an INFICON quartz resonator deposition monitor.

The multilayer films on the silica substrates were used for Seebeck coefficient measurements and the films on the silicon substrates were used for electrical conductivity and thermal conductivity measurements. The geometry in FIG. 1 shows two Au contact layers, one each on the top and bottom of the multilayers. These contacts were used in the Seebeck coefficient measurement system and were also used when electric contact was needed. As seen from FIG. 2 the edge 202 of the top gold contact film was etched using the Ar-ion etching in the IBAD system to prevent short-circuit connections among the multilayers.

The cross plane electrical conductivity was measured by a digital electronic bridge. Any inadvertant Schottky junction barrier created between Cu (or Au depending on the samples) and the multilayered film/sample was assumed to be negligible, and the resistance of the metal contact (Cu or Au) surface electrodes was assumed to be negligible. Resistance readings are combined with length and width measurements and thickness measurements from Atomic Force Microscope (AFM) and optical interference to give electrical conductivity:

$g=t/(Rs)$, where g is the electrical conductivity, t is the thickness of the multilayer stack, R is the resistance measurement, s is the area. Electrical conductivity may also be measured by measuring sheet resistance by a Van der Pauw technique and then using the thickness to determine bulk resistivity. Cross plane electrical conductivity of the multilayered sample was measured before and after bombardment by the 5 MeV Si ion bombardment at the various fluences.

Cross plane thermal conductivity was measured by the 3ω (also referred to as the three omega and third harmonic) technique. The thermal conductivity measurement was performed at 22° C. A narrow platinum (Pt) strip is deposited onto the films, providing a heater with a resistance value of about 200 ohms. Four terminals are provided on the Pt strip, two outer terminals for applying current, and two inner terminals for sensing voltage drop across the strip. The strip is used for applying heat input to the layer and for measuring the resulting temperature changes. A sine wave current at a fundamental frequency ω is applied. This produces heating that has a 2ω component. The resistance of the Pt film is a function of the temperature achieved, which is a function of the thermal conductivity and specific heat of the material in response to the 2ω heating. The voltage across the Pt film is v=I(ω)r (2ω). This product generates a component at 3ω, which may be measured to determine thermal conductivity. The dynamics are well known in the literature. The thermal conductivity, k, may be determined as:

$$k = \frac{V^3 \ln\frac{f_2}{f_1}}{4\pi l R(V_{31} - V_{32})}\alpha$$

Where, $f_1$ and $f_2$ are two test current drive frequencies,
V is the nominal voltage measured across the Pt film,
l is the length of Pt film over which V is measured,
R is the nominal resistance of the Pt film,
α is dR/dT, the dependence of resistance on temperature,
$V_{31}$ is the in phase third harmonic voltage for $f_1$, and
$V_{32}$ is the in phase third harmonic voltage for $f_2$.

The typical length of the test portion of the Pt strip may be 4 to 5 mm and the typical width may be 1 mm. The thickness may be 250 to 500 nm.

Thermal conductivities of multi-layered samples before and after bombardment by 5 MeV Si ion at various fluences were measured. The units are mW/(cm° K). Further details on the third harmonic technique may be found in David G. Cahill, "Thermal conductivity measurement from 30 to 750K: the 3ω method", Review of Scientific Instrumentation, 61(2), February 1990, which is incorporated herein by reference.

Figure 7:
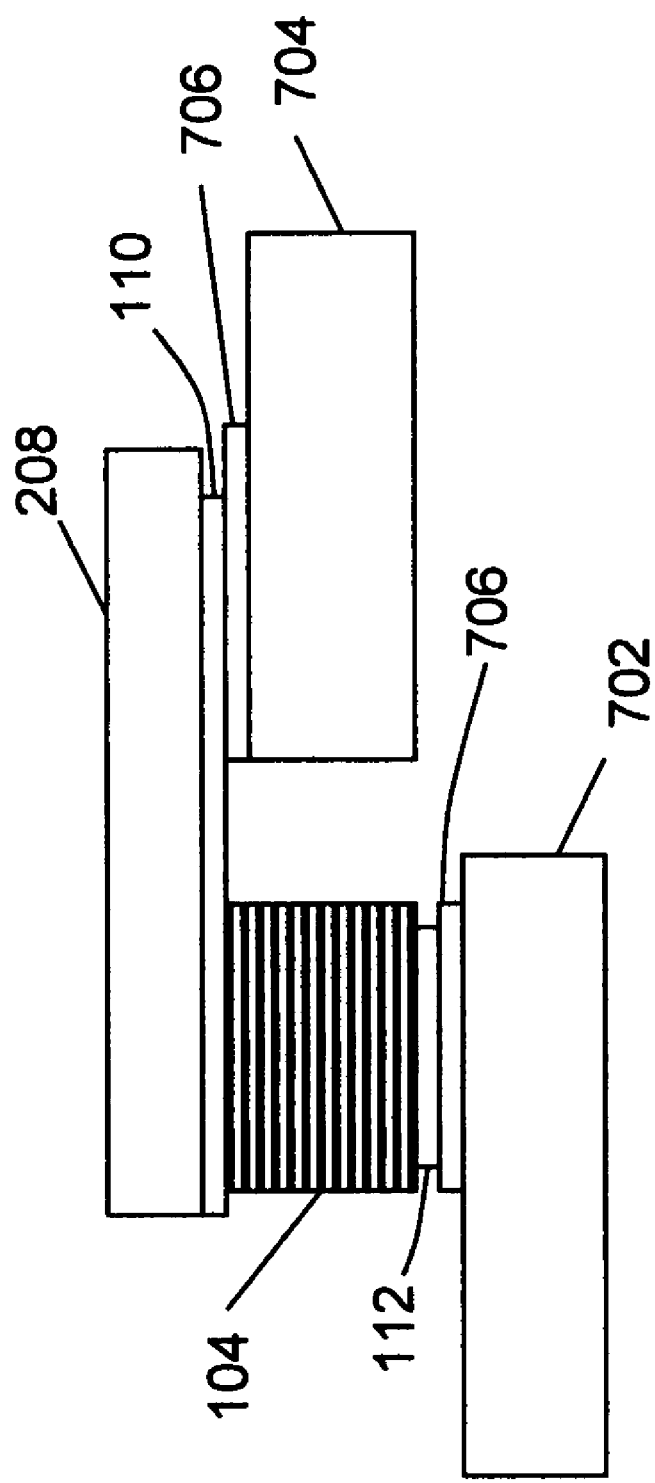
FIG. 7 illustrates a side view of a Seebeck measurement setup utilizing a test sample in accordance with the present invention.

FIG. 7 illustrates a side view of a Seebeck measurement setup utilizing a test sample in accordance with the present invention. Referring to FIG. 7, for cross plane Seebeck coefficient measurements, the samples are deposited between two thermally and electrically conductive metal (Cu or Au) layers 110 and 112 on a fused silica substrate 208. The samples were coupled to the hot end 702 and cold end 704 of the thermal test stage using silver paste 706. The Seebeck coefficient of multilayered samples were measured before and after bombardment by 5 MeV Si ion at various fluences. Seebeck coefficient measurements were made using an SB-100 Seebeck Measurement System from MMR Technologies of Mountain View Calif.

The 5 MeV Si ion bombardments were performed by the Pelletron ion beam accelerator at the Alabama A&M University's Center for Irradiation of Materials (AAMU-CIM). The amount of the energy of the bombarding Si ions was chosen by the SRIM simulation software (Stopping and Range of Ions in Matter) (SRIM). The fluences used for the bombardment were $1 \times 10^{13}$ ions/cm$^2$, $5 \times 10^{13}$ ions/cm$^2$, and $1 \times 10^{14}$ ions/cm$^2$. The lowest thermal conductivity was found at the fluence of $1 \times 10^{14}$ ions/cm$^2$, and the highest electrical conductivity was found at the same fluence. Rutherford Backscattering Spectrometry (RBS) was used to monitor the film thickness and stoichiometry before and after MeV bombardments.

Figure 8:
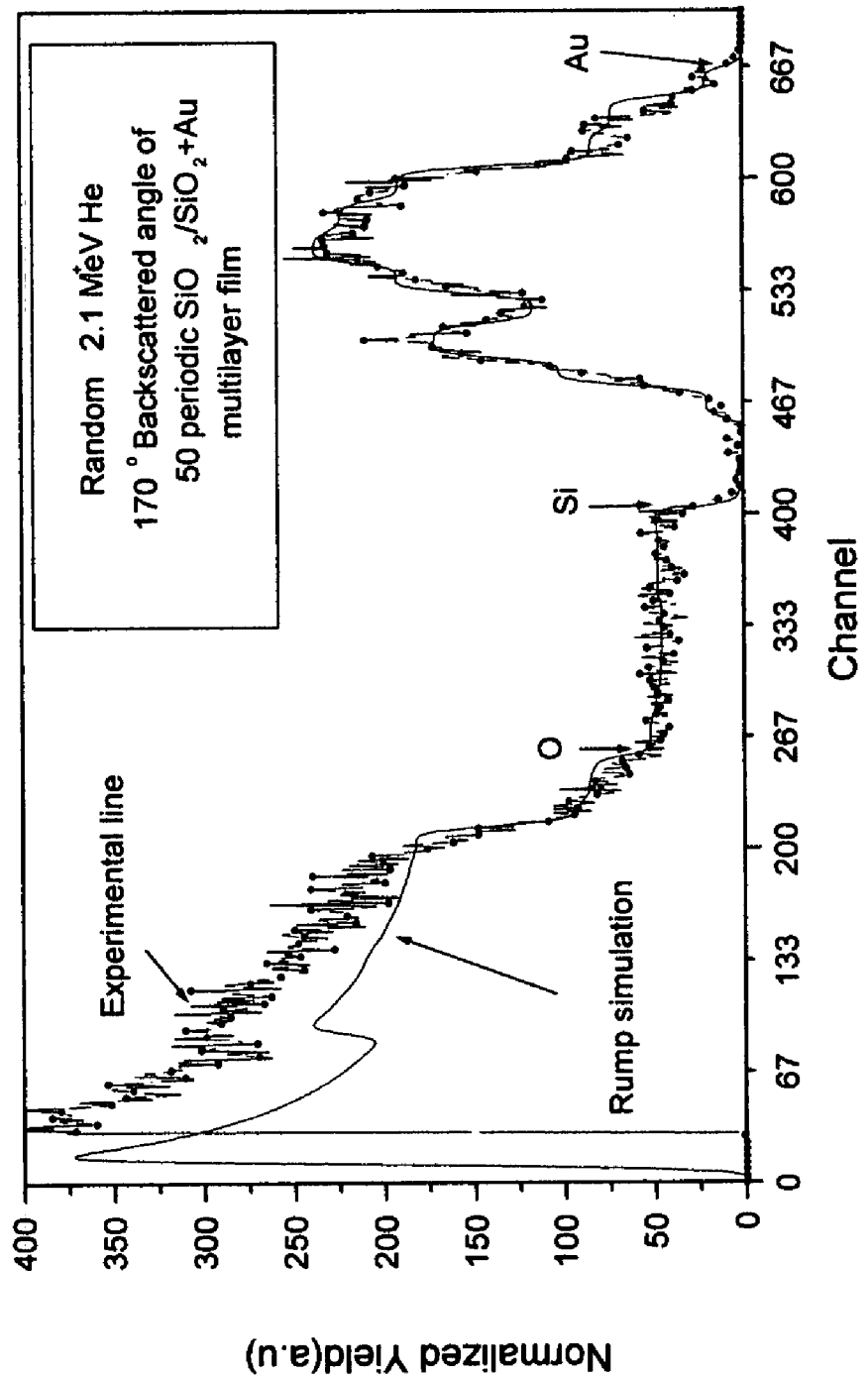
FIG. 8 shows Rutherford Back Scatter (RBS) spectra and RUMP simulation of 50 periodic nano-layers of $SiO_2/Au_x$-$SiO_{2(1-x)}$ film on Si substrate using a helium ion source.

FIG. 8 shows Rutherford Back Scatter (RBS) spectra and RUMP simulation of samples with 50 periodic nano-layers of $SiO_2/Au_xSiO_{2(1-x)}$ film on Si substrate using a helium ion source. No gold contact layers were deposited for this sample. The good agreement between the measured and simulated results indicates achievement of the desired stoichiometry.

Before starting to grow multilayer films, the IBAD system was calibrated using RBS for $SiO_2+Au$ growth. The amount of the gold deposition achieved in the formula of $SiO_2/Au_x(SiO_2)_{(1-x)}$ was measured as a function of the e-beam currents. The current levels that produced a gold deposition fraction of $x=0.04$ were utilized for the gold containing layers in the multilayer stack. ($x=0.04$ indicates 0.04 atoms of gold for 0.96 molecule of $SiO_2$.) By maintaining the same temperatures and other parameters and varying the current level for gold deposition, 50 layer pairs of alternating $SiO_2$ and $Au_x(SiO_2)_{(1-x)}$ were deposited. Although the tested samples used a gold molecular fraction of $x=0.04$ the gold fraction are expected to be effective over a wide range of $0.0001<x<0.20$.

Figure 9:
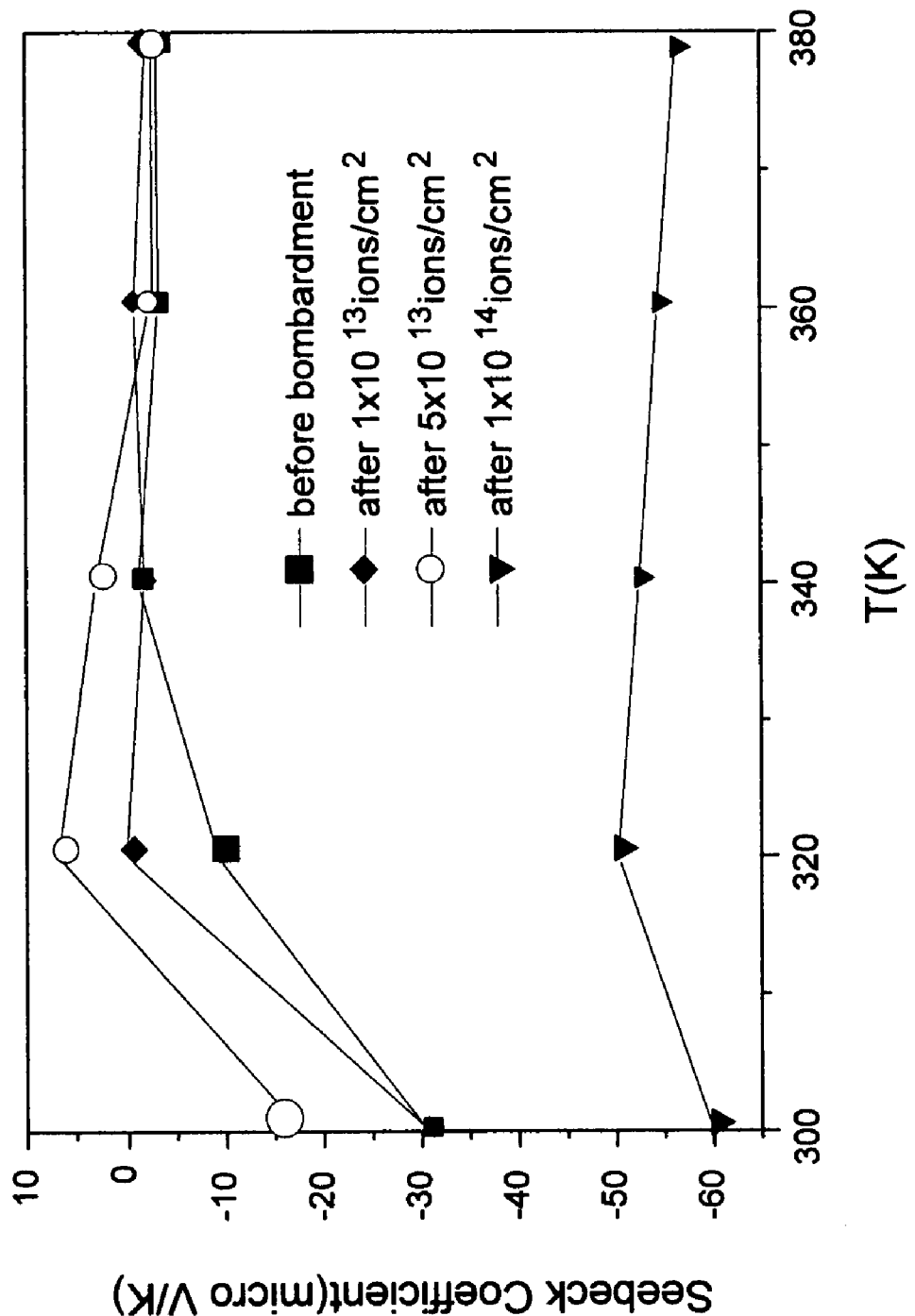
FIG. 9 shows the temperature dependence of the Seebeck Coefficient of the 50 periodic nano-layers of $SiO2/Au_xSiO_{2(1-x)}$ films.

FIG. 9 shows the temperature dependence of the Seebeck Coefficient of the 50 periodic nano-layers of $SiO2/Au_xSiO_{2(1-x)}$ films. As seen from FIG. 3, the Seebeck coefficients showed some dependence on the fluence with an increase in temperature. The highest magnitude Seebeck coefficient was achieved at the highest fluence, $10^{14}$ ions/cm$^2$. The negative sign of the Seebeck coefficient relates to the polarity of the electrical voltage relative to the heat flux direction.

Figure 10A:
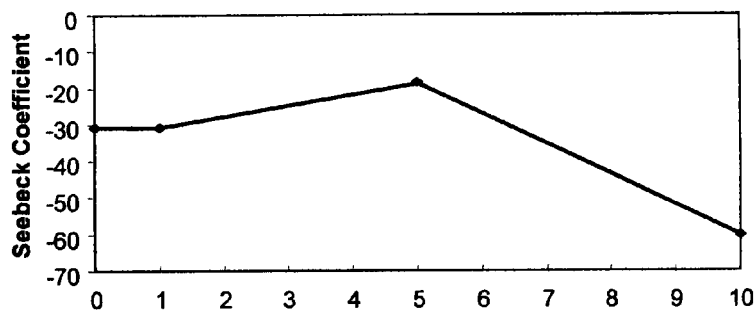
FIG. 10A-FIG. 10E show thermoelectric properties of the 50 periodic nano-layers of $SiO2/Au_xSiO_{2(1-x)}$ films.
Figure 10B:
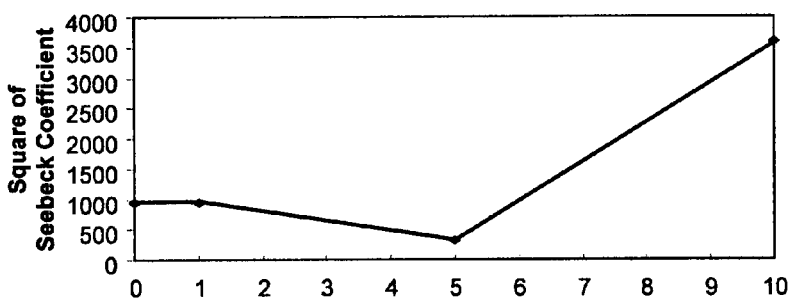
Figure 10C:
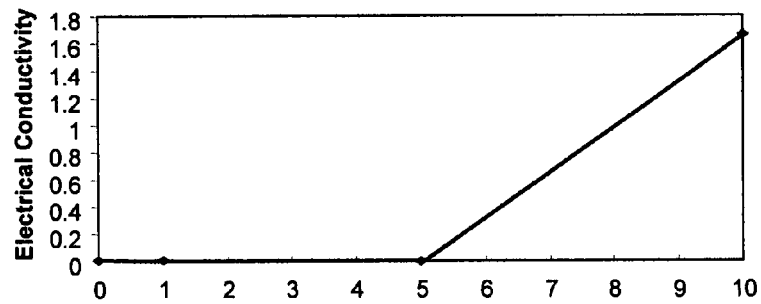

FIG. 10A-FIG. 10E show thermoelectric properties of the 50 periodic nano-layers of $SiO2/Au_xSiO_{2\ (1-x)}$ films. FIG. 10A shows the Seebeck coefficient dependence on the fluence. As seen from FIG. 10A, the Seebeck coefficient was negative in polarity and started to move more positive at the initial fluence and then moved strongly more negative after the fluence of $5 \times 10^{13}$ ions/cm$^2$. The Figure of Merit contains the square of the Seebeck coefficient and the FIG. 10B shows the square of the Seebeck coefficient dependence on the fluences of the bombardment. As seen clearly, the FIG. 10B increases with fluence. FIG. 10C shows the electrical conductivity change depending on the fluence of the bombardment. The electrical conductivity, like the square of the Seebeck coefficient, increased with fluence The bombardment of the sample with 5 MeV Si ions causes an increase in the number of the charge carriers in the conduction and valence bands, which causes a shorter energy gap between the conduction and valence bands and results in an increase in electrical conductivity. Since electrical conductivity is one of the factors in the merit factor of equation 1, increasing electrical conductivity increases the merit factor, which increases the efficiency of devices using the TE material.

Figure 10D:
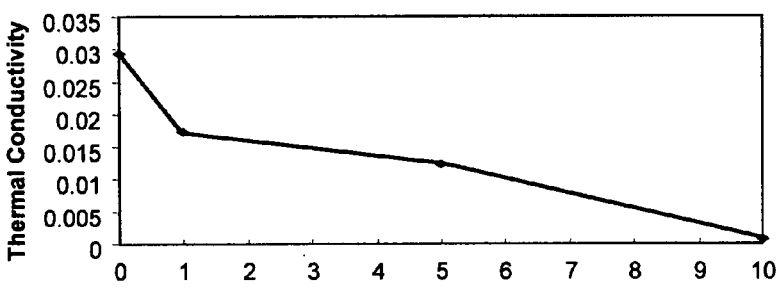

FIG. 10D shows the thermal conductivity as a function of fluence. FIG. 10D shows that the thermal conductivity decreases as the bombardment fluence increases. The bombardment of the sample with 5 MeV Si ions causes tremendous localized heating along the ion track. The heating is sufficient to disrupt the regular pattern of atoms to form scattering structures that remain after cooling to scatter phonons and disrupt heat flow. This effect results in decrease in thermal conductivity. Since thermal conductivity is a factor in the denominator of the merit factor of equation 1, decreasing thermal conductivity increases the merit factor, which increases the efficiency of devices using the TE material.

The production of nanoclusters in the layers caused the increase in electrical conductivity and the decrease in the thermal conductivity. The production of nanoclusters leads to decreased thermal conductivity due to scattering of the phonons and production of mini-bands causing absorption of phonons.

Figure 10E:
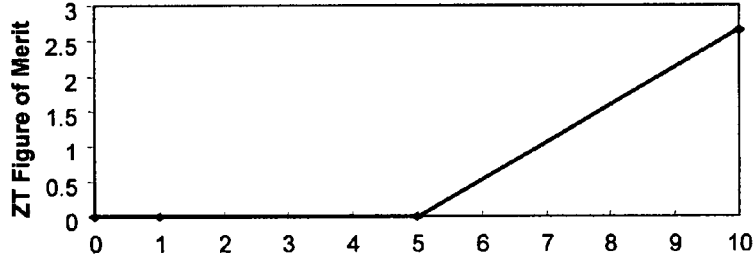

FIG. 10E shows the Figure of Merit as a function of ion bombardment. As seen from FIG. 9E the Figure of Merit increases as the fluence increases. The room temperature Figure of Merit for this sample increased from $0.66 \times 10-4$ at zero fluence to 2.52 at a fluence of $1 \times 10^{14}$ ions/cm$^2$.

Figure 11:
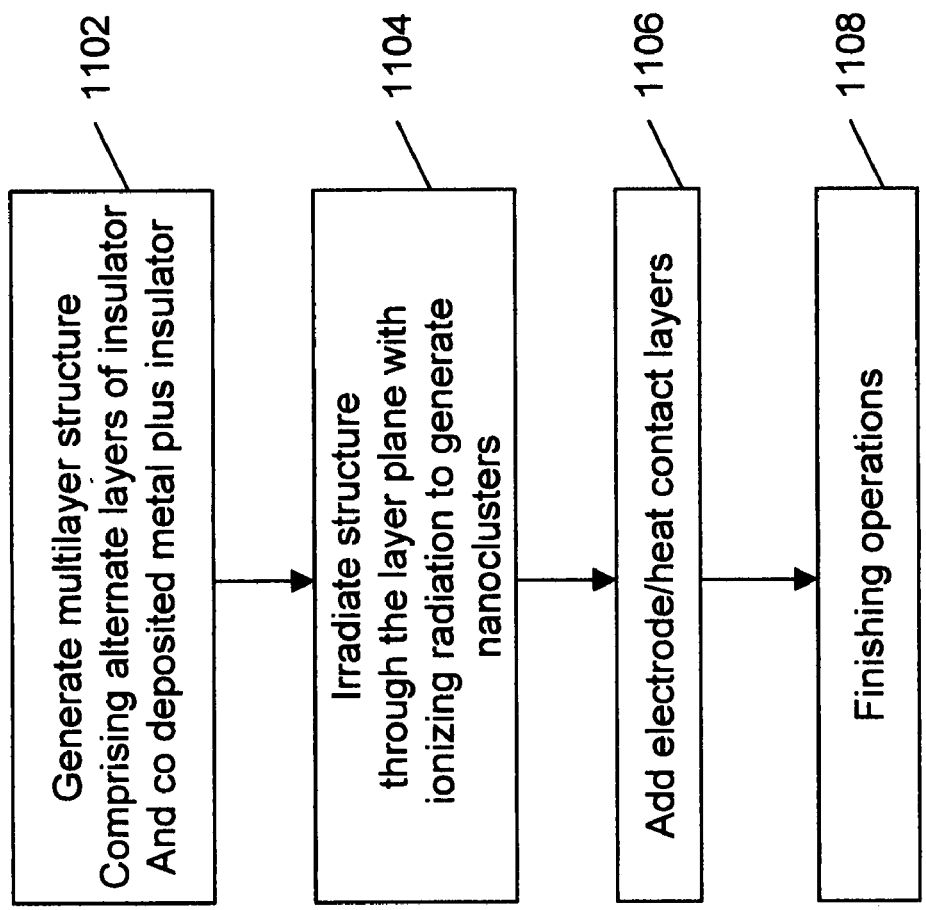
FIG. 11 is an exemplary block diagram illustrating the steps of the process for making a thermoelectric device in accordance with the present invention.

FIG. 11 is an exemplary block diagram illustrating the steps of the process for making a thermoelectric device in accordance with the present invention. Referring to FIG. 11, at step 1102, a periodic multilayer structure is generated comprising periods of alternating layers of insulator and co-deposited metal with insulator. In step 1104, the layers are irradiated with ionizing radiation to produce nanoclusters that enhance electrical conductivity and reduce thermal conductivity to improve the thermoelectric figure of merit. In step 1106, electrical contact layers are applied to the periodic multilayer structure. Electrical contact layers may also provide thermal contact with the heat source and heat sink. The electrical contact layers may be applied in any convenient sequence as part of the layer deposition or afterwards, or before or after irradiation. In step 1108 finishing operations are performed such as trimming edges, packaging, wiring, assembly to heat source and sink.

Figure 12:
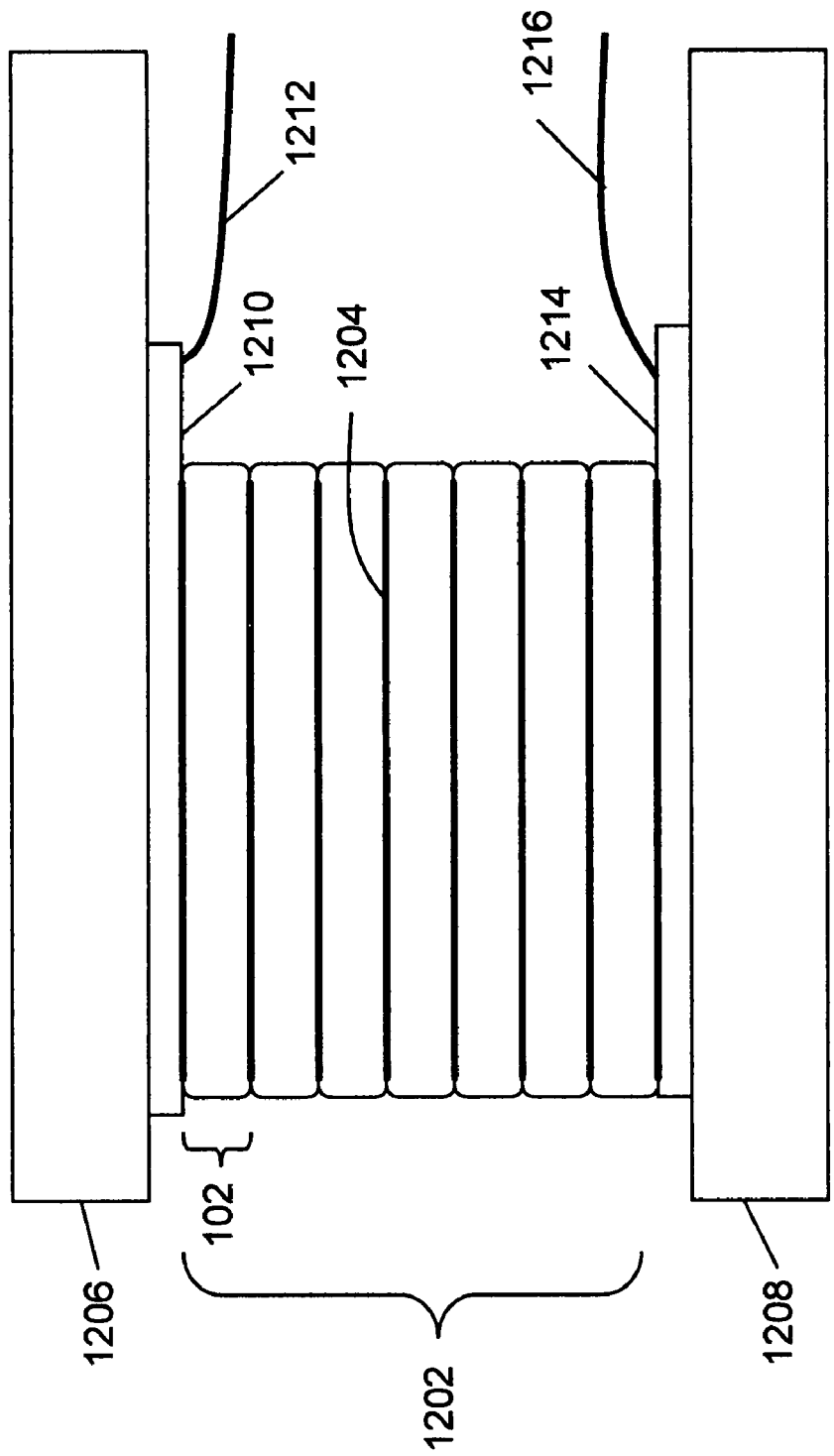
FIG. 12 illustrates an exemplary thermoelectric device utilizing a plurality of multilayer structures stacked in series.

FIG. 12 illustrates an exemplary thermoelectric device utilizing a plurality of multilayer structures stacked in series. The series stack 1202 may have advantages when coupling to thermal sources or sinks at greater temperature differences. Referring to FIG. 12, a stack 1202 of seven multilayer structures 102 is sandwiched between a heat source 1206 and heat sink 1208. Electrical contact layers 1210 and 1214 may also be provided. Wires 1212 and 1216 are shown for coupling to external circuits. The thermal and electrical coupling 1204 between multilayer structures 102 may be accomplished by the contact layer as shown in FIG. 2 or may be by direct contact between multilayer structures.

FIG. 13A and FIG. 13B illustrate the use of the multilayer stack as a thermoelectric generator and as a thermoelectric cooler or heater. Referring to FIG. 13A, a heat source 114 and heat sink 116 apply a temperature difference to the two sides of the multilayer structure 102. The heat flow through the multilayer structure generates thermoelectric voltage which is coupled to a load 1302.

Referring to FIG. 13B, a voltage source powers the multilayer structure 102 for thermoelectric heater and cooler operation. The electric power from the power source 1304 moves heat through the multilayer structure 102, producing a cool side and a hot side. Thus, the multilayer structure may be used as a heat pump to provide heating or cooling as desired.

Applications

Applications for this device include all of the traditional TE generator and TE cooler applications as well as new applications enabled by the higher figure of merit. Some new applications include utilization of wasted energy around the automobile engines (300° K to 370° K), aircraft engines (>300° K), and spacecraft engines (>>300K). Production of energy from the heat in the warm days of the year (>300° K) or from human body heat. Similarly such system can be used to cool down the selected area on a chip by mapping the Peltier device on the back or the front of the micro- or nano-electronic device. As well as application in bio-medical industry to operated in vitro devices using the temperature difference of few degrees to generate power needed to operate such devices for the lifetime of the device with no need for an additional charger or batteries.

The invention is shown with layers in a planar form; however, the layers may be applied to complex curved shapes. In particular cylinders, such as pipes, are commonly used in heat transfer applications. The TE layers may be deposited on the surface of pipes to be used in heat transfer applications.

Conclusion

One should understand that numerous variations may be made by one skilled in the art based on the teachings herein. Such variations include but are not limited to variations in order of steps, additional steps, omitted optional steps or elements. The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A thermoelectric device comprising:
   a periodic multilayer structure having a plurality of periods, each of said periods comprising:
      a first insulating layer comprising a first electrical insulating material, and
      a single composite layer comprising metal material mixture having nanocrystals, nanoclusters, or quantum dots of a metal material and a second insulating material;
   a first contact layer for electrical and thermal coupling to said periodic multilayer structure; and
   a second contact layer for electrical and thermal coupling to said periodic multilayer structure.

2. The thermoelectric device of claim 1, wherein a thickness of the first insulating layer is less than three nanometers.

3. The thermoelectric device of claim 1, wherein a thickness of the composite layer is less than twenty nanometers.

4. The thermoelectric device of claim 1, wherein an operational heat flux direction is through the thickness dimension of the periodic multilayer structure.

5. The thermoelectric device of claim 1, wherein the thermoelectric device is used to generate electric energy from a temperature difference source.

6. The thermoelectric device of claim 1, wherein the thermoelectric device is used to produce a temperature difference from an electrical energy source.

7. The thermoelectric device of claim 1, wherein the first electrical insulating material and second electrical insulating material are the same material.

8. The thermoelectric device of claim 1, wherein the number of periods in the periodic multilayer structure is greater than 40.

9. The thermoelectric device of claim 1, wherein the first electrical insulating material is $SiO_2$.

10. The thermoelectric device of claim 1, wherein the metal material co-deposited with said second electrical insulating material is gold.

11. The thermoelectric device as recited in claim 1, wherein said nanocrystals, or said nanoclusters, or said quantum dots are formed by ionizing radiation.

12. The thermoelectric device of claim 11, wherein the ionizing radiation comprises x-rays, gamma rays, electrons, protons, or ions.

13. The thermoelectric device of claim 12, wherein the ionizing radiation comprises ions with initial energy greater than 3 MeV.

14. The thermoelectric device of claim 13, wherein the ion initial energy is selected such that an ion stopping power decreases through subsequent periods of the periodic multilayer structure.

15. The thermoelectric device of claim 13, wherein the ionizing radiation has a fluence greater than $10^{13}$ ions per square centimeter.

16. The thermoelectric device of claim 11, wherein the ionizing radiation penetrates all layers of the periodic multilayer structure.

* * * * *